United States Patent
Singh et al.

(10) Patent No.: US 11,195,947 B2
(45) Date of Patent: Dec. 7, 2021

(54) SEMICONDUCTOR DEVICE WITH DOPED REGION ADJACENT ISOLATION STRUCTURE IN EXTENSION REGION

(71) Applicant: GLOBALFOUNDRIES U.S. Inc., Santa Clara, CA (US)

(72) Inventors: Jagar Singh, Clifton Park, NY (US); Luigi Pantisano, Saratoga Springs, NY (US); Anvitha Shampur, Malta, NY (US); Frank Scott Johnson, Saratoga Springs, NY (US); Srikanth Balaji Samavedam, Cohoes, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 74 days.

(21) Appl. No.: 16/662,276

(22) Filed: Oct. 24, 2019

(65) Prior Publication Data
US 2021/0126126 A1 Apr. 29, 2021

(51) Int. Cl.
*H01L 29/78* (2006.01)
*H01L 21/8238* (2006.01)
(Continued)

(52) U.S. Cl.
CPC ........ *H01L 29/7816* (2013.01); *H01L 21/761* (2013.01); *H01L 21/823481* (2013.01); *H01L 21/823493* (2013.01); *H01L 21/823814* (2013.01); *H01L 21/823821* (2013.01); *H01L 21/823878* (2013.01);
(Continued)

(58) Field of Classification Search
CPC ............. H01L 21/761; H01L 21/76237; H01L 21/823418; H01L 21/823431; H01L 21/823481; H01L 21/823493; H01L 21/823814; H01L 21/823821; H01L 21/823878; H01L 21/823892; H01L 29/0646; H01L 29/0653; H01L 29/0688; H01L 29/0865; H01L 29/0882; H01L 29/42376; H01L 29/66659; H01L 29/66681; H01L 29/66795; H01L 29/7816;
(Continued)

(56) References Cited

U.S. PATENT DOCUMENTS

| | | | |
|---|---|---|---|
| 6,576,959 B2 * | 6/2003 | Kunz | .................. H01L 27/0262 257/355 |
| 7,405,443 B1 | 7/2008 | Zuniga et al. | |

(Continued)

*Primary Examiner* — Joseph C. Nicely
(74) *Attorney, Agent, or Firm* — Hoffman Warnick LLC

(57) ABSTRACT

A semiconductor device is disclosed including a semiconductor layer, a first well doped with dopants of a first conductivity type defined in the semiconductor layer, a second well doped with dopants of a second conductivity type different than the first conductivity type defined in the semiconductor layer adjacent the first well to define a PN junction between the first and second wells, and an isolation structure positioned in the second well. The semiconductor device also includes a first source/drain region positioned in the first well, a second source/drain region positioned in the second well adjacent a first side of the isolation structure, a doped region positioned in the second well adjacent a second side of the isolation structure, and a gate structure positioned above the semiconductor layer, wherein the gate structure vertically overlaps a portion of the doped region.

19 Claims, 3 Drawing Sheets

(51) Int. Cl.
*H01L 29/66* (2006.01)
*H01L 27/092* (2006.01)
*H01L 21/761* (2006.01)
*H01L 21/8234* (2006.01)
*H01L 29/423* (2006.01)
*H01L 29/06* (2006.01)

(52) U.S. Cl.
CPC .. *H01L 21/823892* (2013.01); *H01L 27/0924* (2013.01); *H01L 29/0646* (2013.01); *H01L 29/0653* (2013.01); *H01L 29/42376* (2013.01); *H01L 29/66659* (2013.01); *H01L 29/66681* (2013.01); *H01L 29/66795* (2013.01); *H01L 29/785* (2013.01)

(58) Field of Classification Search
CPC .............. H01L 29/785; H01L 29/7851; H01L 27/0924
See application file for complete search history.

(56) References Cited

U.S. PATENT DOCUMENTS

| | | |
|---|---|---|
| 9,082,852 B1 | 7/2015 | Liu et al. |
| 9,379,236 B2 | 6/2016 | Ponoth et al. |
| 10,121,878 B1* | 11/2018 | Ciavatti .............. H01L 29/7816 |
| 2003/0001198 A1 | 1/2003 | Bromberger et al. |
| 2007/0228425 A1 | 10/2007 | Miller et al. |
| 2008/0246080 A1* | 10/2008 | Ito ........................ H01L 29/7835 257/328 |
| 2011/0169079 A1* | 7/2011 | Ito ..................... H01L 29/66659 257/337 |
| 2012/0199878 A1* | 8/2012 | Shrivastava .......... H01L 29/665 257/192 |
| 2013/0062692 A1* | 3/2013 | Chen .................... H01L 29/785 257/335 |
| 2014/0015048 A1 | 1/2014 | Ng et al. |
| 2015/0035053 A1 | 2/2015 | Singh |
| 2015/0287780 A1* | 10/2015 | Zhang ................. H01L 29/7843 257/339 |
| 2017/0365603 A1* | 12/2017 | Zhou .................... H01L 29/785 |
| 2018/0108755 A1* | 4/2018 | Liu ..................... H01L 29/7835 |
| 2019/0148543 A1* | 5/2019 | Kojima ............... H01L 29/0634 257/335 |
| 2019/0259875 A1* | 8/2019 | Li ....................... H01L 29/0847 |
| 2020/0135917 A1* | 4/2020 | Singh .................. H01L 29/0882 |

* cited by examiner

View X-X

View X-X

SEMICONDUCTOR DEVICE WITH DOPED REGION ADJACENT ISOLATION STRUCTURE IN EXTENSION REGION

BACKGROUND

Field of the Invention

The present disclosure relates to semiconductor devices and to a method of forming semiconductor devices, and, more particularly, to a semiconductor device with a doped region adjacent an isolation structure in the extension region and methods for making same.

Description of the Related Art

In recent years, lateral double-diffused metal-oxide-semiconductor field effect transistors (LDMOSFETs) have been increasingly applied in high voltage and smart power applications. The advantages over vertical double-diffused MOSFETs (VDMOSFETs) are a reduction in the number of application steps, multiple output capability on the same chip, and compatibility with advanced very large scale integration (VLSI) technologies. LDMOSFETs with VLSI processes are expected to drive ICs to wider fields of complex applications, such as intelligent power ICs.

Generally, LDMOSFETs implement an asymmetric structure with an isolation structure located in an extension region between the channel and a source/drain contact of the LDMOSFET. For LDMOSFET devices implemented using a finFET platform, the high drive current and the wrapping of the gate electrode around the fin increases defect density. As a result, charge trapping occurs in the gate dielectric and the isolation structure that defines the extension region, thereby affecting the channel operating characteristics.

The present disclosure is directed to various methods of forming an LDMOSFET and the resulting device that may avoid, or at least reduce, the effects of one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In accordance with a first aspect of the present invention, a semiconductor device is provided. In accordance with one illustrative embodiment herein, the semiconductor device includes, among other things, a semiconductor layer, a first well doped with dopants of a first conductivity type defined in the semiconductor layer, a second well doped with dopants of a second conductivity type different than the first conductivity type defined in the semiconductor layer adjacent the first well to define a PN junction between the first and second wells, and an isolation structure positioned in the second well. In this illustrative embodiment, the semiconductor device also includes a first source/drain region positioned in the first well, a second source/drain region positioned in the second well adjacent a first side of the isolation structure, a doped region positioned in the second well adjacent a second side of the isolation structure, and a gate structure positioned above the semiconductor layer, wherein the gate structure vertically overlaps a portion of the doped region.

In accordance with another illustrative embodiment herein, the semiconductor device includes, among other things, a semiconductor layer, a fin positioned above the semiconductor layer, a first well doped with dopants of a first conductivity type defined in the fin and the semiconductor layer, a second well doped with dopants of a second conductivity type different than the first conductivity type defined in the fin and the semiconductor layer adjacent the first well to define a PN junction between the first and second wells, and an isolation structure positioned in the second well. In this illustrative embodiment, the device also includes a first source/drain region positioned in the first well, a second source/drain region positioned in the second well adjacent a first side of the isolation structure, wherein an extension region is defined between the isolation structure and the PN junction, a doped region positioned in the extension region adjacent a second side of the isolation structure, and a gate structure positioned above the fin and the semiconductor layer, wherein the gate structure vertically overlaps a portion of the doped region.

One illustrative method disclosed herein includes, among other things, forming a fin above a semiconductor layer, forming a first well doped with dopants of a first conductivity type defined in the fin and the semiconductor layer, forming a second well doped with dopants of a second conductivity type different than the first conductivity type defined in the fin and the semiconductor layer adjacent the first well to define a PN junction between the first and second wells, and forming an isolation structure in the second well. The method further includes forming a first source/drain region in the first well, forming a second source/drain region in the second well adjacent a first side of the isolation structure, wherein an extension region is defined between the isolation structure and the PN junction, forming a doped region in the extension region adjacent a second side of the isolation structure, and forming a gate structure above the fin and the semiconductor layer, wherein the gate structure vertically overlaps a portion of the doped region.

BRIEF DESCRIPTION OF THE DRAWINGS

The disclosure may be understood by reference to the following description taken in conjunction with the accompanying drawings, in which like reference numerals identify like elements, and in which.

Figure 1:
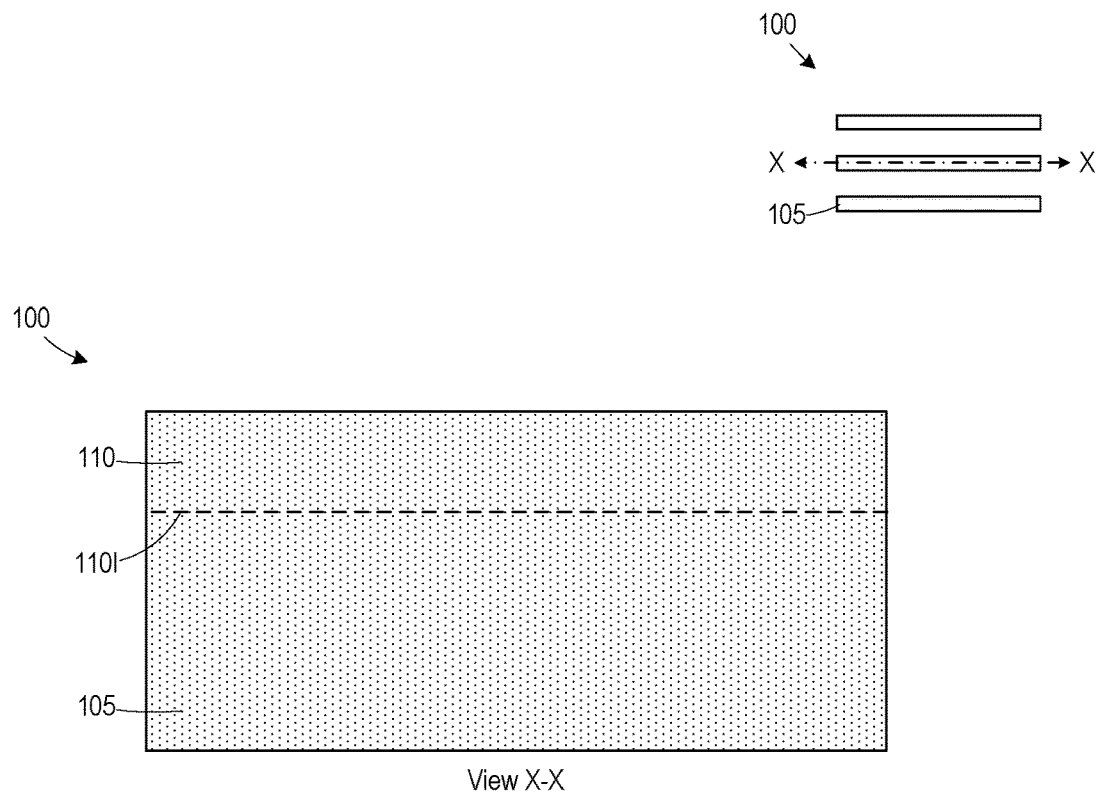
FIGS. 1-6 depict a method for forming an LDMOS device and the resulting device, in accordance with some embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless or otherwise indicated, all numbers expressing quantities, ratios and numerical properties of ingredients, reaction conditions and so forth used in the specification and claims are to be understood as being modified in all instances by the term "about."

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The person skilled in the art will appreciate that, although a semiconductor device may be provided by a MOS device, the expression "MOS" does not imply any limitation, i.e., a MOS device is not limited to a metal-oxide-semiconductor configuration, but may also comprise a semiconductor-oxide-semiconductor configuration and the like.

FIGS. 1-6 schematically depict various illustrative embodiments of aspects of a novel lateral double-diffused metal-oxide-semiconductor (LDMOS) device 100 disclosed herein. In a general sense, in one broad aspect, the present disclosure is related to the formation of a novel field effect structure wherein a doped region is formed in a portion of an extension region positioned under a gate structure of the LDMOS device 100 and adjacent an isolation structure separating the extension region from a source/drain region of the LDMOS device 100. The doped region reduces charge trapping in the isolation structure and the gate structure.

FIG. 1 illustrates the LDMOS device 100 at a very early stage of manufacture. FIGS. 1-6 include a simplistic plan view showing where various cross-sectional views are taken. Referring to FIG. 1, the view X-X is a cross-sectional view taken through the semiconductor arrangement 100 in a direction corresponding to a gate length direction through a fin. Not all aspects of the processing shown in the cross-sectional views will be depicted in the plan view.

An illustrative semiconductor layer 105, such as a silicon substrate having a bulk or so-called silicon-on-insulator (SOI) configuration, was provided. Of course, the semiconductor layer 105 may be comprised of a variety of materials other than silicon, depending upon the particular application. The semiconductor layer 105 may be lightly pre-doped with dopants of a first conductivity type, such as P-type dopants (e.g., boron and the like), or may be undoped. A patterned etch process was performed to define fins 110 in the semiconductor layer 105.

In some embodiments, fins 110 were formed above the semiconductor layer 105 by etching trenches in the semiconductor layer 105 using a patterned hard mask. The interface between the fins 110 and the semiconductor layer 105 is demarcated by a dashed line 110I. In this embodiment, the fins 110 were formed from a portion of the semiconductor layer 105 that remains between trenches in the semiconductor layer 105. In some embodiments, the fins 110 were formed, such as grown, over the semiconductor layer 105. For example, the fins 110 may be formed by forming the semiconductor layer 105 over a substrate and etching trenches in the semiconductor layer 105. In some embodiments, fins that were initially formed in the semiconductor layer 105 are replaced. For example, the fins 110 may be initially defined by forming trenches in the semiconductor layer 105, forming a dielectric layer between the initially formed fins, and planarizing the dielectric layer to expose upper surfaces of the initially formed fins. An etch process may be performed to remove at least portions of the initially formed fins, and a growth process may be performed to form replacement fins with one or more different material characteristics compared to the initially formed fins (e.g., a different silicon alloy material, a different dopant concentration, etc.)

Figure 2:
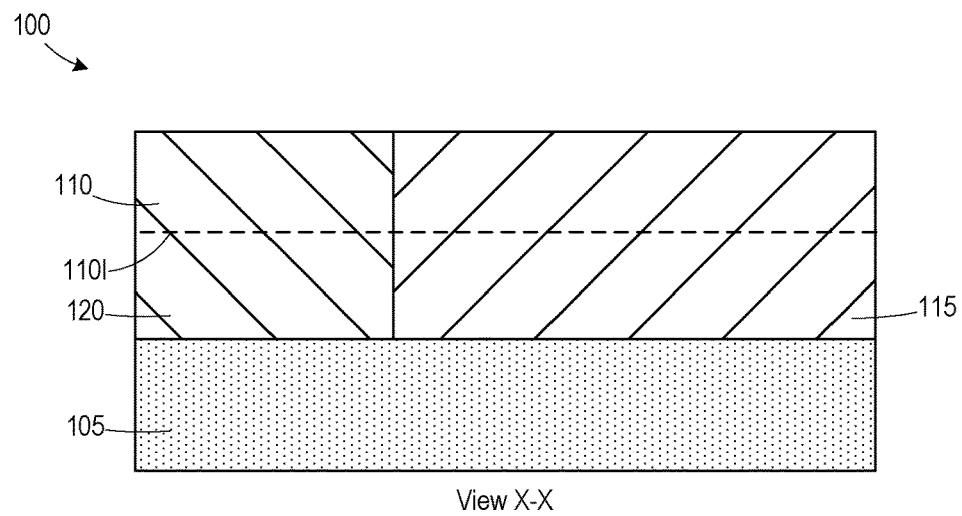

FIG. 2 illustrates the LDMOS device 100 after a plurality of masked implantation processes were performed to define an N-well 115 (e.g., doped with an N-type dopant, such as phosphorus or arsenic) and a P-well 120 (e.g., doped with a P-type dopant, such as boron). The N-well 115 and the P-well 120 extend through an entire height of the fin 110 past the interface 110I and into the semiconductor layer 105.

Figure 3:
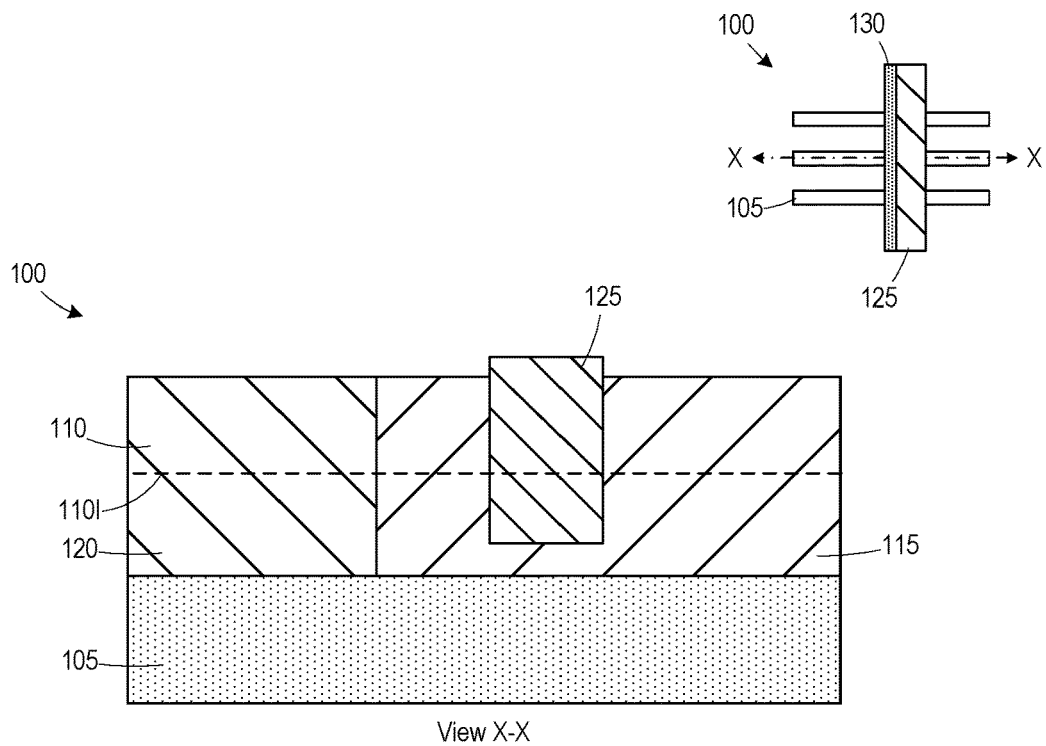

FIG. 3 illustrates the LDMOS device 100 after an isolation structure 125 was formed in the fins 110. A patterned mask layer may be used to remove a portion of the fins 110 to define a trench, and a dielectric material (e.g., silicon dioxide) may be formed in the trench. The isolation structure 125 extends through an entire height of the fin 110 past the interface 110I and into the semiconductor layer 105. In some embodiments, the isolation structure 125 is positioned in the N-well 115.

Figure 4:
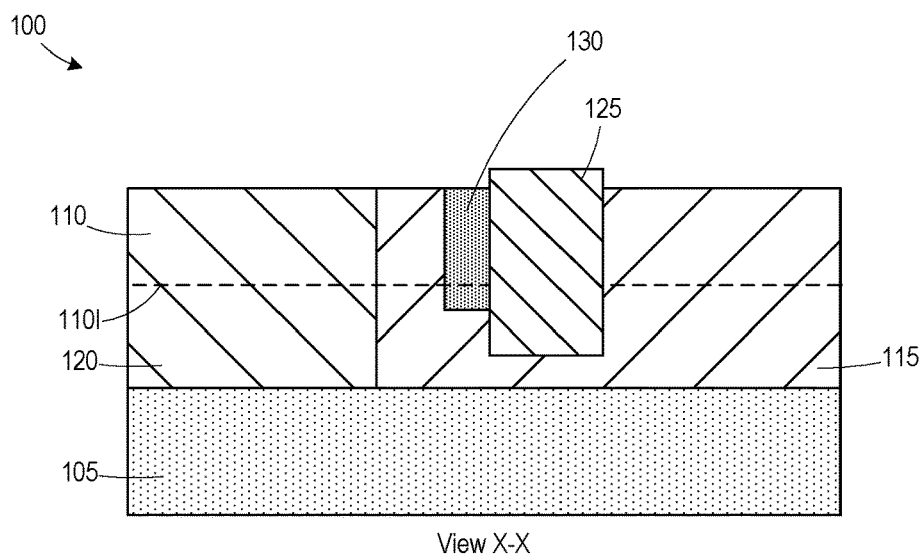

FIG. 4 illustrates the LDMOS device 100 after a masked implantation process was performed to define an N-doped region 130 in the N-well 115 adjacent the isolation structure 125 (e.g., doped with an N-type dopant at a higher concentration than the N-well 115). The N-doped region 130 extends through an entire height of the fin 110 past the interface 110I and into the semiconductor layer 105. In some embodiments, the masked implantation process to define the N-doped region 130 is performed prior to forming the isolation structure 125.

Figure 5:
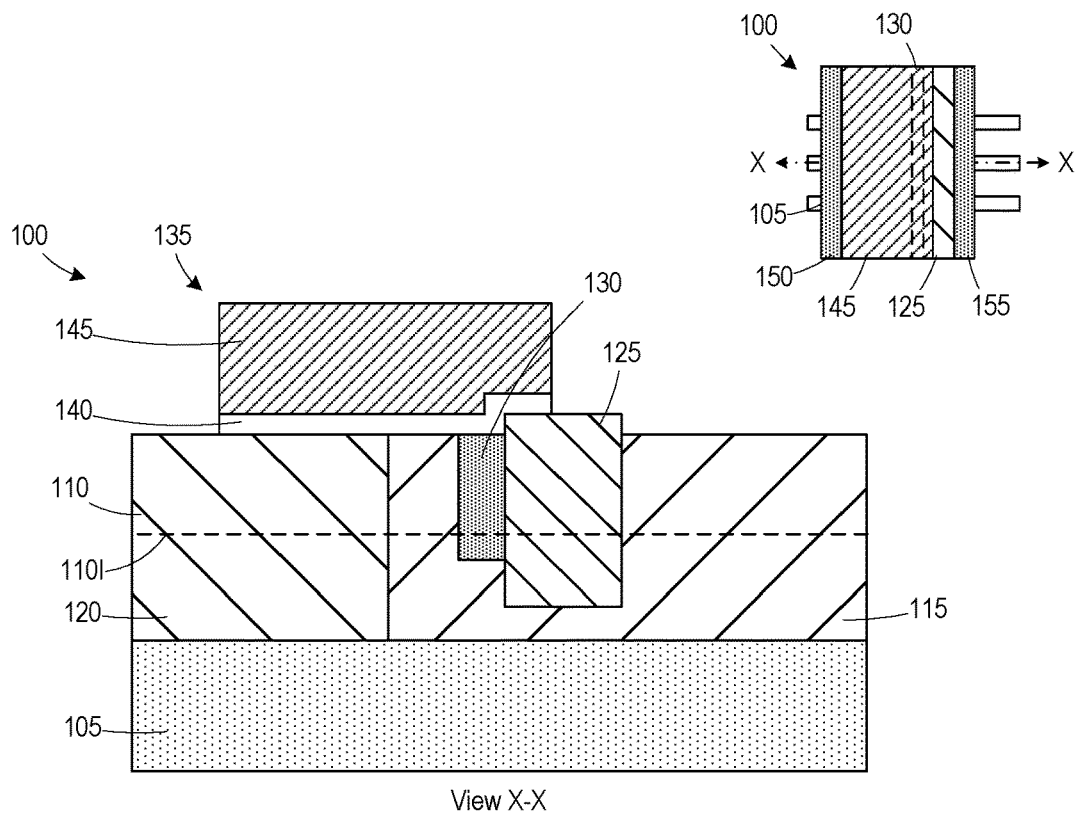

FIG. 5 illustrates the LDMOS device 100 after several processes were performed to form a gate structure 135 over the fins 110. In some embodiments, the gate structure 135 vertically overlaps the doped region 130 and a portion of the isolation structure 125. In some embodiments, the gate structure 135 includes a gate insulation layer 140 (e.g., silicon dioxide or a high-k dielectric, such as hafnium dioxide) and a gate electrode 145 (e.g., doped polysilicon). According to some embodiments, the gate structure 135 is formed by forming a layer stack over the fins 110 including a layer of gate dielectric material, a layer of gate electrode material over the gate dielectric material, and a hard mask layer over the layer of gate electrode material. In some embodiments, a patterning process is performed to pattern the hard mask layer corresponding to the pattern of gate structures to be formed, and an etch process is performed using the patterned hard mask layer to etch the gate electrode layer and the gate dielectric layer to define the gate structure 135. Although not illustrated, remaining portions of the hard mask layer may remain to form a cap layer over the gate structure 135. According to some embodiments, the gate structure 135 includes sacrificial structures that may be later replaced with different gate dielectric and electrode materials (such as a replacement metal gate).

Figure 6:
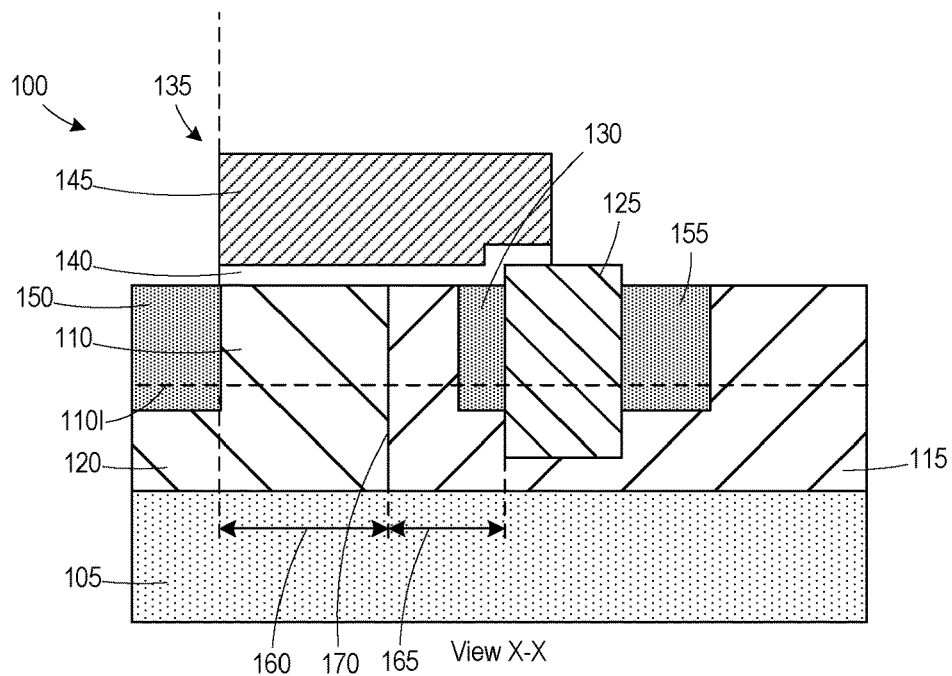

FIG. 6 illustrates the LDMOS device 100 after one or more additional N-type implantations were performed to define an N-type (N+) source/drain region 150 in the P-well 120 and an N-type (N+) source/drain region 155 in the N-well 115. In some embodiments, a sidewall spacer (not shown) may be formed on the gate structure 135 to control the spacing between the source/drain region 150 and the gate structure 135.

A channel region 160 is defined in the P-well 120 under the gate structure 135. An extension region 165 is defined in the N-well 115 between a PN junction 170 defined between the N-well 115 and the P-well 120 and the source/drain region 155. The gate structure 135 vertically overlaps a portion of the extension region 165. The isolation structure 125 is positioned between the extension region 165 and the source/drain region 155. The doped region 130 is positioned in the extension region 165 adjacent the isolation structure 125. The shape of the N-type source/drain regions 150, 155 in FIG. 6 is only meant as a general representation. The actual shape may be varied by performing multiple implantation steps with different mask profiles. The LDMOS device 100 illustrated in FIG. 6 is a NPN device. In some embodiments, the dopant types are reversed to provide a PNP device, where the doped region 130 has P-type dopants and is positioned in a P-well.

Additional processing steps may be performed to complete the fabrication of the LDMOS device 100. For example, contacts may be formed connected to the source/drain regions 150, 155 and the gate electrode 145. Additional metallization layers may be formed above the LDMOS device 100.

Providing the doped region 130 in the extension region 165 adjacent the isolation structure 125 reduces the vertical resistance of the extension region 165, providing a higher drive current. The doped region 130 also limits the fin body charge influence on the extension region 165, reducing charge trapping in the isolation structure 125 and the portion of the gate dielectric layer 140 vertically overlapping extension region 165 and the doped region 130.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A semiconductor device, comprising:
   a semiconductor layer;
   a first well doped with dopants of a first conductivity type defined in the semiconductor layer;
   a second well doped with dopants of a second conductivity type different than the first conductivity type defined in the semiconductor layer adjacent the first well to define a PN junction between the first and second wells;
   an isolation structure positioned in the second well;
   a first source/drain region positioned in the first well;
   a second source/drain region positioned in the second well adjacent a first side of the isolation structure, wherein the first and second source/drain regions and a doped region are doped with dopants of the second conductivity type;
   the doped region positioned in the second well adjacent a second side of the isolation structure; and
   a gate structure positioned above the semiconductor layer, wherein the gate structure vertically overlaps a portion of the doped region.

2. The semiconductor device of claim 1, wherein the gate structure vertically overlaps a portion of the isolation structure.

3. The semiconductor device of claim 1, further comprising a fin positioned over the semiconductor layer, wherein the isolation structure and the doped region extend through the fin and into a portion of the semiconductor layer below an interface between the fin and the semiconductor layer.

4. The semiconductor device of claim 1, wherein the second well defines an extension region between the isolation structure and the PN junction.

5. The semiconductor device of claim 4, wherein the doped region is positioned in the extension region.

6. The semiconductor device of claim 1, wherein the gate structure is positioned vertically above and overlapping the PN junction.

7. The semiconductor device of claim 1, wherein a channel region is defined between the first source/drain region and the PN junction.

8. A semiconductor device, comprising:
   a semiconductor layer;
   a fin positioned above the semiconductor layer;
   a first well doped with dopants of a first conductivity type defined in the fin and the semiconductor layer;
   a second well doped with dopants of a second conductivity type different than the first conductivity type defined in the fin and the semiconductor layer adjacent the first well to define a PN junction between the first and second wells;
   an isolation structure positioned in the second well;
   a first source/drain region positioned in the first well;
   a second source/drain region positioned in the second well adjacent a first side of the isolation structure, wherein an extension region is defined between the isolation structure and the PN junction;

a doped region positioned in the extension region adjacent a second side of the isolation structure; and a gate structure positioned above the fin and the semiconductor layer, wherein the gate structure vertically overlaps a portion of the doped region.

9. The semiconductor device of claim 8, wherein the first and second source/drain regions and the doped region are doped with dopants of the second conductivity type.

10. The semiconductor device of claim 9, wherein the gate structure vertically overlaps a portion of the isolation structure.

11. The semiconductor device of claim 8, wherein the gate structure is positioned vertically above and overlapping the PN junction.

12. The semiconductor device of claim 8, wherein a channel region is defined between the first source/drain region and the PN junction.

13. A method, comprising:

forming a fin above a semiconductor layer;

forming a first well doped with dopants of a first conductivity type defined in the fin and the semiconductor layer;

forming a second well doped with dopants of a second conductivity type different than the first conductivity type defined in the fin and the semiconductor layer adjacent the first well to define a PN junction between the first and second wells;

forming an isolation structure in the second well;

forming a first source/drain region in the first well;

forming a second source/drain region in the second well adjacent a first side of the isolation structure, wherein an extension region is defined between the isolation structure and the PN junction;

forming a doped region in the extension region adjacent a second side of the isolation structure; and forming a gate structure above the fin and the semiconductor layer, wherein the gate structure vertically overlaps a portion of the doped region.

14. The method of claim 13, wherein the first and second source/drain regions and the doped region are doped with dopants of the second conductivity type.

15. The method of claim 14, wherein the gate structure vertically overlaps a portion of the isolation structure.

16. The method of claim 14, wherein the gate structure is positioned vertically above and overlapping the PN junction.

17. The method of claim 14, wherein a channel region is defined between the first source/drain region and the PN junction.

18. The method of claim 14, wherein forming the doped region comprises forming the doped region after forming the isolation structure.

19. The method of claim 14, wherein forming the doped region comprises forming the doped region prior to forming the isolation structure.

\* \* \* \* \*